United States Patent [19]

Bhattacharyya et al.

[11] Patent Number: 5,307,012
[45] Date of Patent: Apr. 26, 1994

[54] TEST SUBSTATION FOR TESTING SEMI-CONDUCTOR PACKAGES

[75] Inventors: Bidyut K. Bhattacharyya, Chandler, Ariz.; Jim Cattedra, Del Mar, Calif.

[73] Assignee: Intel Corporation, Santa Clara, Calif.

[21] Appl. No.: 37,674

[22] Filed: Mar. 25, 1993

Related U.S. Application Data

[63] Continuation of Ser. No. 802,008, Dec. 3, 1991, abandoned.

[51] Int. Cl.$^5$ .............................................. G01R 31/26
[52] U.S. Cl. ............................ 324/158 F; 324/158 P; 439/71
[58] Field of Search ............... 324/158 R, 72.5, 158 P, 324/158 F; 361/412, 414, 424; 174/35 R; 333/246; 439/71, 70

[56]  References Cited

U.S. PATENT DOCUMENTS

| | | | |
|---|---|---|---|
| 4,473,798 | 9/1984 | Cedrone et al. ................ | 324/158 P |
| 4,539,621 | 9/1985 | Currier ................ | 361/424 |
| 4,574,235 | 3/1986 | Kelly et al. ................ | 324/158 F |
| 4,668,041 | 5/1987 | La Komski et al. ................ | 324/158 F |
| 4,739,257 | 4/1988 | Jenson et al. ................ | 324/158 F |
| 4,835,464 | 5/1989 | Slye et al. ................ | 324/158 F |
| 4,851,764 | 7/1989 | Usui ................ | 324/158 F |
| 4,866,507 | 9/1989 | Jacobs et al. ................ | 361/412 |
| 4,879,434 | 11/1989 | Assel et al. ................ | 174/35 R |
| 4,912,401 | 3/1990 | Nady, II et al. ................ | 324/158 F |
| 4,928,061 | 5/1990 | Dampier et al. ................ | 324/158 F |
| 4,931,726 | 6/1990 | Kasukabe et al. ................ | 324/158 F |
| 4,945,633 | 8/1990 | Hakanen et al. ................ | 174/35 R |
| 4,970,460 | 11/1990 | Jensen et al. ................ | 324/158 P |
| 4,972,297 | 11/1990 | Zell et al. ................ | 174/35 R |
| 5,006,667 | 4/1991 | Lonka ................ | 174/35 R |
| 5,043,534 | 8/1991 | Mahulikar et al. ................ | 174/35 R |

FOREIGN PATENT DOCUMENTS

| | | | |
|---|---|---|---|
| 0069958 | 3/1989 | Japan ................ | 324/158 F |
| 8304315 | 12/1983 | PCT Int'l Appl. ................ | 324/158 P |

Primary Examiner—Vinh Nguyen
Attorney, Agent, or Firm—Blakely, Sokoloff, Taylor & Zafman

[57] ABSTRACT

A test apparatus that electrically couples a semiconductor package with a test board. The apparatus has a plurality of first contacts that engage the leads of the package. The first contacts are attached to a housing which has four grounding rods spaced a predetermined distance from the first contacts. The rods are electrically grounded and absorb the inductive fields generated by the first contacts in contact with the power and ground leads of the package. The rods extend around the package to control the inductance of the first contacts of the apparatus. The test apparatus may also have a circuit board connected to the first contacts by a plurality of second contacts. A number of spring biased pins are incorporated to couple the circuit board to the test board. The circuit board has both power and ground planes that are coupled to the power and ground leads of the package. The circuit board decouples the power and ground leads and controls the capacitance of the first contacts of the apparatus.

34 Claims, 4 Drawing Sheets

TEST SUBSTATION FOR TESTING SEMI-CONDUCTOR PACKAGES

This is a continuation of application Ser. No. 07/802,008 filed Dec. 3, 1991, now abandoned.

BACKGROUND OF THE INVENTION

1. Field of the Invention

This invention relates to a testing apparatus used to electrically test semiconductor package devices.

2. Description of Related Art

Integrated circuits are usually housed within a protective ceramic or plastic package. The package has a plurality of leads that are soldered to a printed circuit board. Before the packages are mounted to the boards, the integrated circuits are usually individually tested to insure that the circuits are not defective. The packages are typically connected to a test circuit board by a number of spring biased leads that provide a conductive path between the package leads and the test board. The spring leads are arranged in a pattern to match the package leads, so that a spring lead engages and couples each package lead to the test board. Once connected, the integrated circuits are electrically tested by testing equipment connected to the test board.

The packages have leads that are designated for ground, power and digital signals. When engaged, the spring biased leads create an additional conductor length between the package leads and the test board. The additional conductor length generates inductive effects between the power leads and the signal leads, producing an undesirable amount of noise on the signal leads. The electrical noise can create faulty test results, which incorrectly indicate that the integrated circuit is defective. The problem is particularly acute with high speed devices. An undeterminable number of packages are improperly rejected as bad, which results in a lower yield of parts.

One possible solution is to decrease the amount of power on each power lead. This approach increases the number of power and ground leads required for each package for a given power. Increasing the power leads requires either a reduction in the number of signal leads, or a decrease in lead spacing. Both solutions are undesirable in that design trends always dictate more signal pins not less, and a decrease in lead spacing compromises the structural integrity of the package. Therefore it would be desirable to have an apparatus that couples a semiconductor package device with a test board that greatly decreases the noise in the testing apparatus.

SUMMARY OF THE INVENTION

The present invention is a test apparatus that electrically couples a semiconductor package with a test board. The apparatus has a plurality of first contacts that engage the leads of the package. The first contacts are attached to a housing which has four grounding rods spaced a predetermined distance from the first contacts. The rods are electrically grounded and absorb the inductive fields generated by the first contacts in contact with the power and ground leads of the package. The rods are arranged so as to form a continuous conductive ring, secured by both the housing of the first contacts and four end caps. The rods extend about the perimeter of the package leads to control the inductance of the first contacts of the apparatus.

The test apparatus may also have a circuit board connected to the first contacts by a plurality of second contacts. A number of spring biased pins are incorporated into the housing to couple the circuit board to the test board. The circuit board has both power and ground planes that are coupled through the contacts to the power and ground leads of the package. The circuit board decouples the power and ground leads and controls the capacitance of the first contacts of the apparatus.

Therefore it is an object of this invention to provide a test apparatus that can couple a semiconductor package to a test board, while controlling the inductance and capacitance of the test leads.

It is also an object of this invention to provide a test apparatus that can couple a semiconductor package to a test board, which has capacitors connected to the package leads.

It is also an object of this invention to provide a test apparatus that can test high speed semiconductor packages.

BRIEF DESCRIPTION OF THE DRAWINGS

The objects and advantages of the present invention will become more readily apparent to those skilled in the art after reviewing the following detailed description and accompanying drawings, wherein:

FIG. 4b is a top view of the circuit board of FIG. 4a;

FIG. 4c is a bottom view of the circuit board of FIG. 4a.

DETAILED DESCRIPTION OF THE INVENTION

Figure 1:
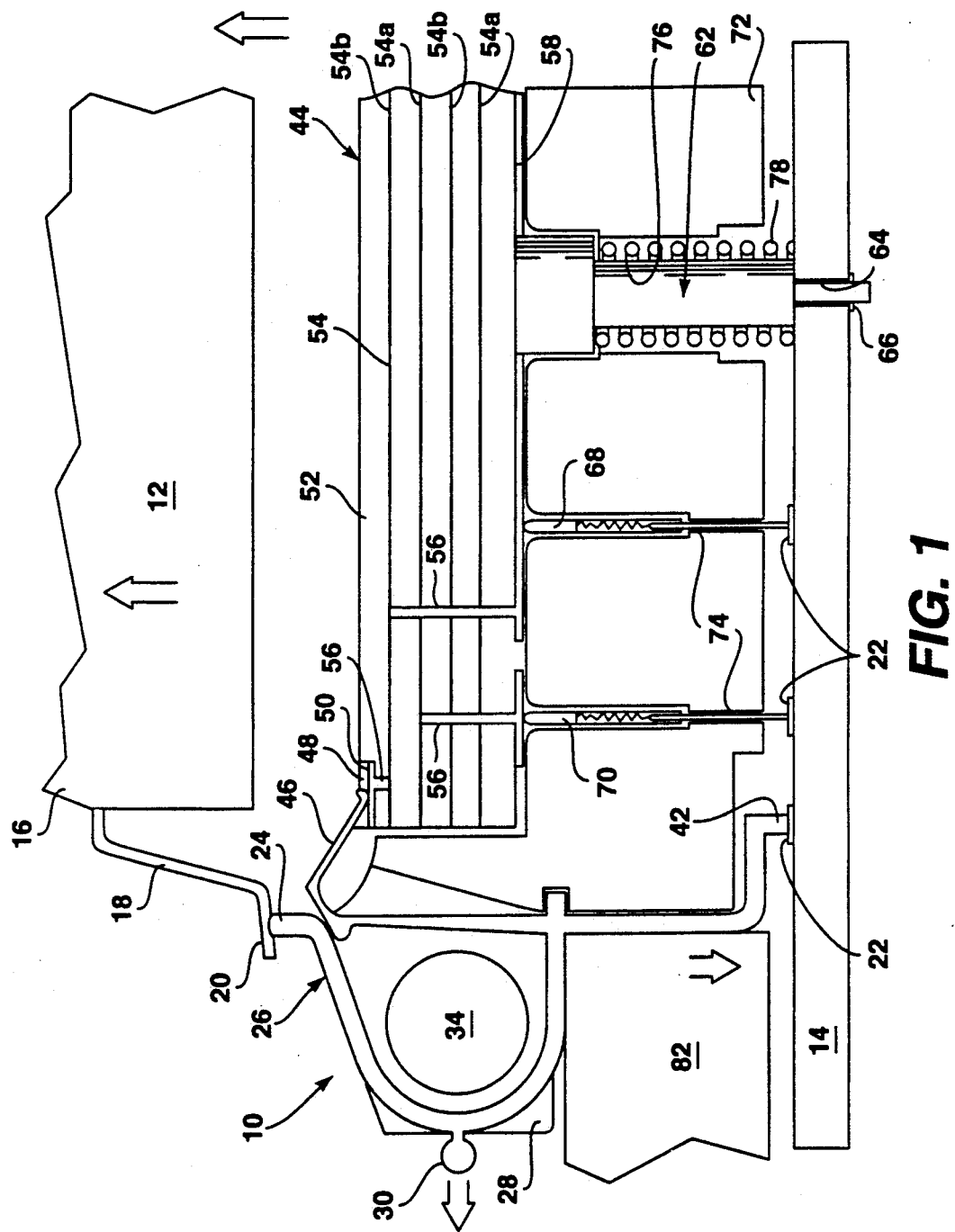
FIG. 1, is a cross-sectional view showing a test apparatus of invention.

Referring to the drawings more particularly by reference numbers, FIG. 1 shows a testing apparatus 10 that electrically couples a semiconductor package device 12 with a test board 14. The package 12 may be any standard chip carrier assembled with a plastic or ceramic first housing 16 that contains an integrated circuit (not shown). The package 12 also has a plurality of leads 18 that extend from the first housing 16, that interconnect the integrated circuit with any external device. The package 12 has designated leads that provide power and ground to the integrated circuit. The package 12 also has leads designated to the transmission of digital signals. The leads 18 are typically constructed from copper wire spaced apart 0.016 to 0.100 inches. The leads 18 may be S shaped (gull wing) and have a bottom foot pad 20 as shown. The test board 14 is typically a printed circuit board that is connected to other testing equipment used to electrically test the package 12. The test board 14 may have surface pads 22 that allow the test apparatus 10 to be electrically connected to the board 14.

Figure 2:
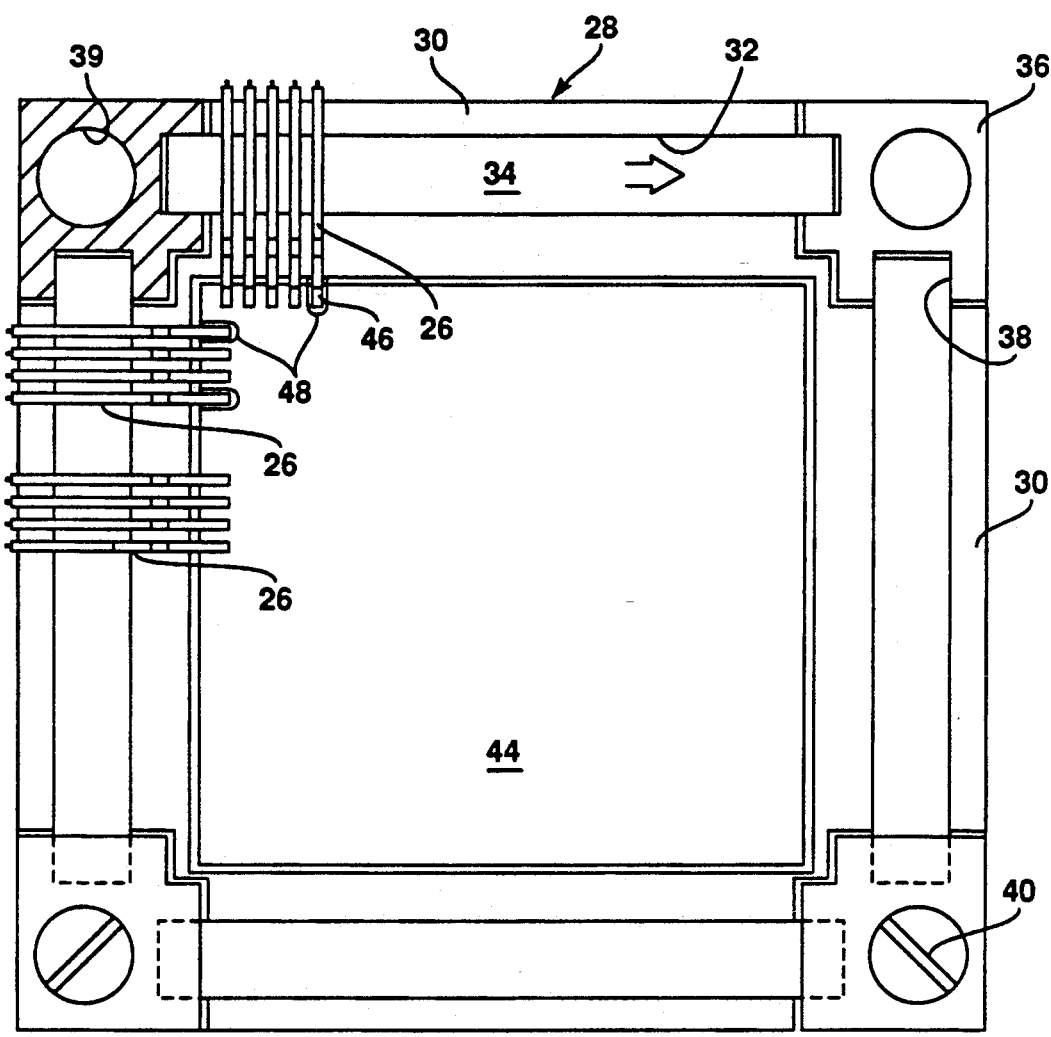
FIG. 2 a top view showing ground rods contained by a housing.
Figure 2A:
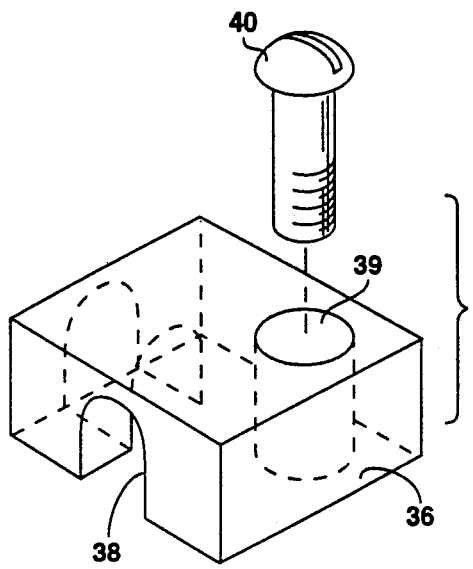
FIG. 2a is a perspective view showing an end cap of the test of FIG. 1.

The testing apparatus 10 has a first conductive contact 26, that is constructed to engage a lead 18 of the package 12. The first contact 26 has a head 24 that applies pressure to the lead 18, to insure a positive electrical contact between the two members when the package 12 is inserted into the apparatus 10. As shown in FIG. 2, there are typically a plurality of first contacts 26 attached to a first housing 28 that has four walls 30 which extend around the package 12. The first housing 28 is preferably constructed from a dielectric material such as plastic. Each wall 30 has a bore 32, which allows a rod 34 to be inserted into the housing 28. The rods 34 are constructed from a conductive material such as copper. The rods 34 are restrained within the walls 30 by end caps 36 that have slots 38 which fit over the ends of the rods 34. As shown in FIG. 2a, the end caps 36 each have holes 39 adapted to receive the shank of a mounting screw 40, that can fasten the end caps 36 and housing 28 to the test board 14. The end caps 36 and mounting screws 40 are constructed from conductive material so that the rods 34 are electrically grounded to the board 14.

Figure 3:
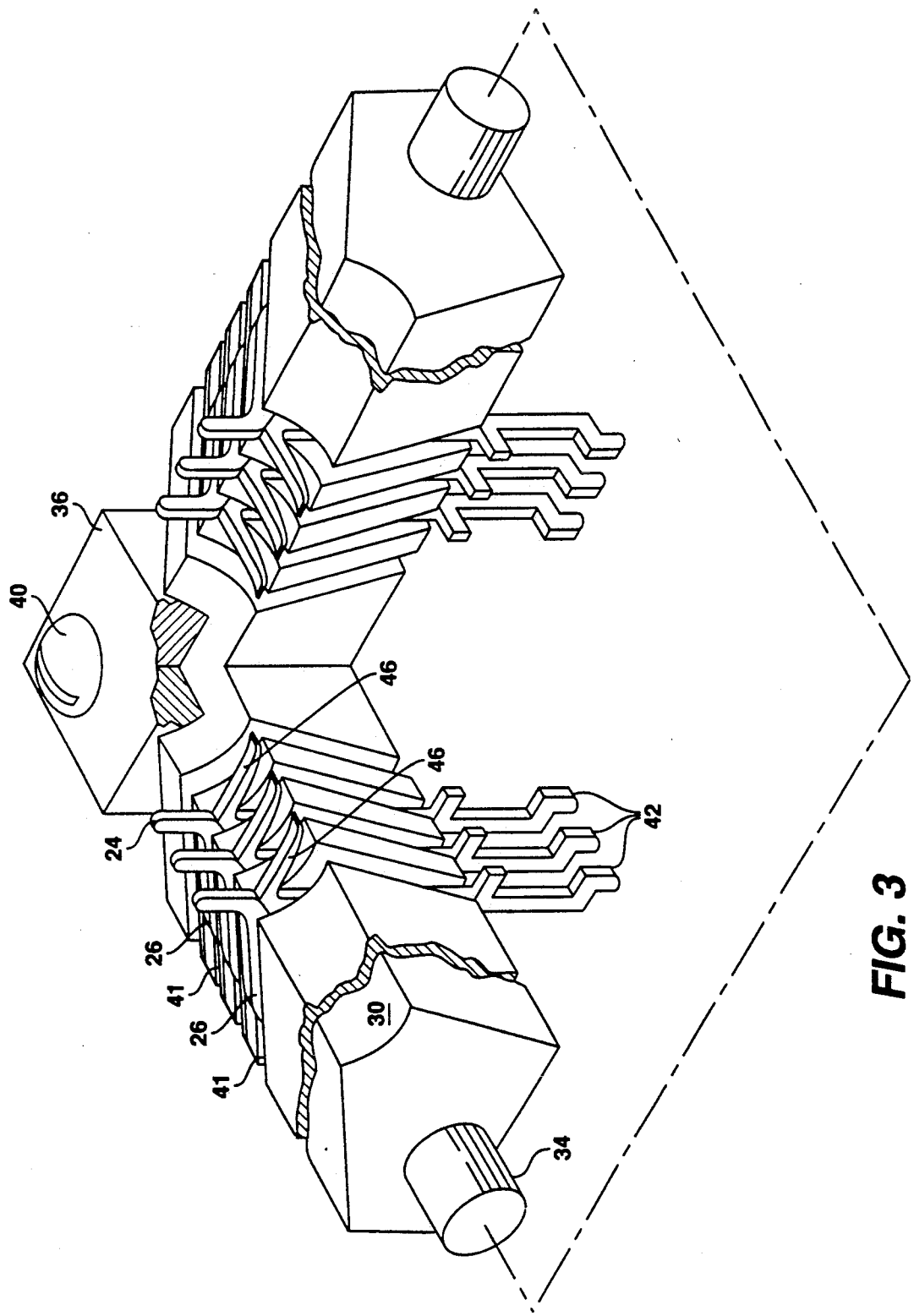
FIG. 3 is a perspective view showing first contacts within slots of the housing.

As shown in FIG. 3, the first contacts 26 fit within slots 41 formed in the walls 30. The first contacts 26 have contact feet 42 that can engage the test board 14 to create an electrical contact between the leads 18 of the package 12 and the board 14. The feet 42 can be either soldered or in pressure contact with the board 14.

The rods 34 absorb most if not all of the magnetic flux generated by the first contacts 26 when current flows from the leads 18 to the board 14. The current induced onto the rods 34 by the magnetic flux is grounded to the test board 14 through the end caps 36 and mounting screws. The rods 34 provide a means to control the inductance effects between the first contacts 26, thereby reducing the noise throughout the testing apparatus 10.

Figure 4A:
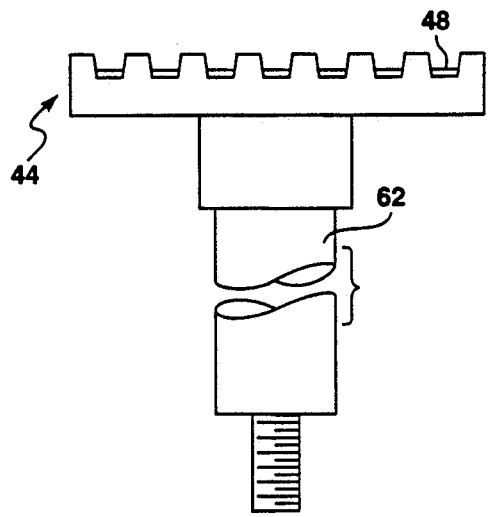
FIG. 4a is a side view of a circuit board that can be incorporated with the test apparatus.
Figure 4B:
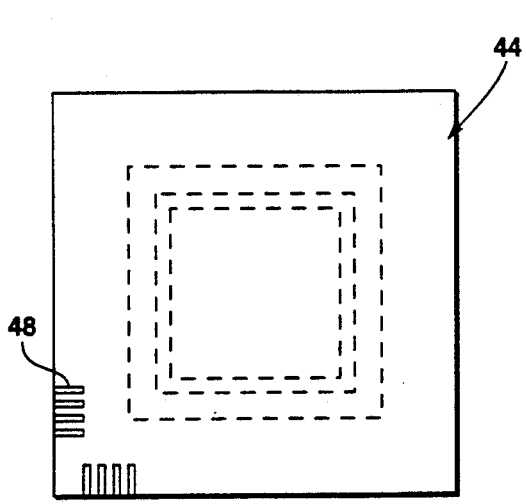
Figure 4C:
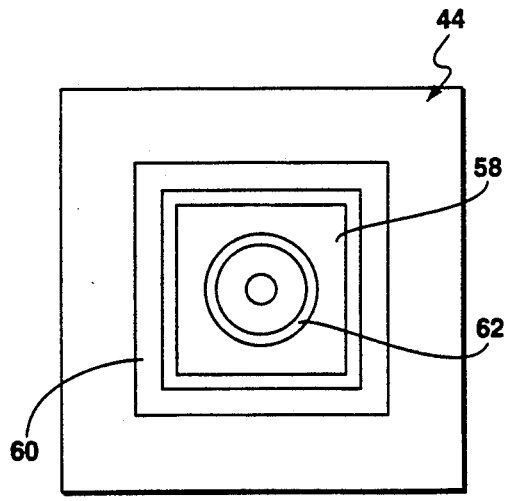

As shown in FIGS. 4a-4c, the testing apparatus 10 may have a circuit board 44 to decouple the power and ground leads, and control the capacitance of the first contacts 26. The circuit board 44 may be used in conjunction with, or as an alternative to the rods 34. The testing apparatus 10 may have a plurality of second contacts 46 that can fit within a plurality of grooves 48 within the circuit board 44. The second contacts 46 are also in contact with the first contacts 26 so that the circuit board 44 is coupled to the leads 18. The grooves 48 may have metalized pads 50 that provide electrical contact with the second contacts 46. The metalized pads 50 are preferably constructed with consecutive layers of tungsten, nickel and chromium, which are electrolytically plated with gold.

The circuit board 44 is preferably constructed from alternating layers of dielectric 52 and conductive 54 material. In the preferred embodiment, the dielectric is a ceramic and the conductor is tungsten. The conductive layers 54 are typically attached to the metalized pads 50 by vias 56. The conductive layers 54 form power 54a and ground planes 54b that can be connected, through the second contacts 46, to the power and ground leads of the package 12. The ceramic dielectric 52 can be approximately 0.001 inches thick and can create a dielectric constant between 8 and 15.

The circuit board 44 may have an external ground plane 58 and an external power plane 60 on the bottom surface of the board. The external power 60 and ground 58 planes are typically connected to the internal power 54a and ground planes 54b by vias 56. The vias 56 provide an electrical connection between the metalized pads 50 and the external planes 58 and 60, so that the power and ground leads of the package 12 are coupled to the corresponding external power 60 and ground 58 planes of the circuit board 44. Attached to the bottom of the circuit board 44 is a ground stud 62, which is typically brazed to the board 44. As shown in FIG. 1, the ground stud 62 extends through a hole 64 in the test board 14 and is attached to the board 14 by a nut 66. The ground stud 64 locates and supports the circuit board 44 relative to the test board 14. The ground stud 64 is also electrically connected to the external ground plane 58, so that the stud 62 grounds the circuit board 44 to the test board 14.

The test apparatus 10 may have second contacts 46 which correspond to the signal leads 18 of the package 12. The second signal contacts 46 also engage the grooves 48 of the circuit board 44. The grooves 48 for the signal contacts 46 may or may not be metalized, depending upon whether it is desirable to attach the signal lines to the circuit board 44. If signal routing is desired, the board 44 may have internal signal lines (not shown) that are attached to the signal pads 50 that are in contact with the second signal contacts 46. The internal signal lines would be connected by vias 56 to external pads on the bottom of the board 44, that could be coupled to the test board 14.

Between the test board 14 and circuit board 44 are at least one spring biased ground pogo pin 68, that electrically couples the external ground plane 58 to a ground plane on the test board 14. The ground pogo pins 68 further ground the ground planes 54b of the circuit board 44. The test apparatus 10 may also have at least one spring biased power pogo pin 70, that electrically couples the external power plane 60 with a power plane on the test board 14. The pogo pins 68 and 70, are contained by a second housing 72. As shown in FIG. 1, the second housing 72 and the first housing 28 may be constructed as one integral housing preferably made from a dielectric material such as plastic. The base portion 72 has pogo bores 74 to allow the pogo pins to extend therethrough. The second housing 72 also has a center hole 76 to allow the ground stud 62 to extend into the test board 14. The center hole 76 can be used to align the circuit board 44 with the test board 14, so that the ground 68 and power 70 pogo pins are in contact with the ground and power planes of the circuit and test boards, respectively.

The second contacts 46 are shaped as cantilever springs that apply pressure to the grooves 48 of the circuit board 44. The test apparatus 10 may have a spring 78 that biases the ground stud 62 and circuit board 44 away from the test board 14 toward the package 12. The spring 78 force causes the circuit board 44 to deflect the second contacts 46, to create sufficient contact pressure between the second contacts 46 and the metalized pads 50. The contact pressure insures an electrical contact between the circuit board 44 and second contacts 46. The engagement of the first contact 26 with the second contact 46, prevents the second contact 46 from being bent back to release the circuit board 44. The first contacts 26 may have a tab 80 that aids in the removal or replacement of the circuit board 44. There is typically a tab 80 associated with each first probe 26 and with each wall 30 of the housing 28. The tabs 80 can be connected to another fixture which allows simultaneous operation of all the tabs.

The test apparatus 10 may also have an alignment plate 82 adjacent to the first housing 26, which is typically constructed from a dielectric material. The alignment plate 82 may have four holes (not shown) that are concentric with the holes 40 of the end caps 36, to allow the housing 28 to be aligned and attached to the alignment plate 82. The plate 82 may be registered with the test board 14 by a dowel pin or other means. One of the four holes in the test board 14 and alignment plate 82 is typically established as a datum point for the assembly 10. The alignment plate 82 aligns the first contact 26, with the leads 18 and the test board 14. The alignment plate 82 can further align the second contacts 46 with the grooves 48 in the circuit board 44. The first contacts 26 are retained against the second housing 72 and aligned within the first housing 28 by the alignment plate 82.

The apparatus 10 can be disassembled with the following method. Move the package 12 in the direction indicated by the arrow. Unfasten the nut 66 on the end of the ground stud 62. Remove the four mounting screws 40 from the end caps 36, and remove the caps 36 and test board 14 from the housing 28. Pull the four ground rods 32 out of the first housing 28, as indicated by the arrow in FIG. 2. Place the remaining assembly in the fixture. Remove the alignment plate 82 in the direction as indicated by the arrow in FIG. 1. Pull the tab 80 in the direction indicated by the arrow, to remove the first 28 and second 46 contacts from the housings 28 and 72. This will now provide clearance for removal of the circuit board 44 in the direction indicated by the arrow and away from the housing 72.

While certain exemplary embodiments have been described in detail and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An apparatus that electrically couples a test board to a semiconductor package that has at least one lead, comprising;
    a housing;
    at least one first contact attached to said housing and adapted to engage the lead of the semiconductor package and the test board, such that the semiconductor package is electrically coupled to the test board, said first contact forming a loop which defines a first contact opening; and,
    a rod that is attached to said housing and extending through and separated from said first contact opening, said rod being electrically grounded to control the inductance of said first contact.

2. The apparatus as recited in claim 1, wherein said housing has four walls that each contain one.

3. The apparatus as recited in claim 2, wherein said housing has four end caps, said each end cap restrains and electrically grounds said rod.

4. The apparatus as recited in claim 3, wherein said end caps are mounted to the test board with four screws, each said screw electrically grounds said end caps and said rod.

5. The apparatus as recited in claim 1, wherein said first contact is a conductor that extends around said rod.

6. The apparatus as recited in claim 1, further comprising capacitance means operatively connected to said first contact and the test board for controlling the capacitance of said first contact.

7. The apparatus as recited in claim 6, wherein said capacitance means is a circuit board with at least one internal conductive layer coupled to said first contact and the test board.

8. The apparatus as recited in claim 7, wherein said circuit board has at least one internal ground plane coupled to at least one ground lead of the semiconductor package, and at least one internal power plane coupled to at least one power lead of the semiconductor package.

9. The apparatus as recited in claim 8, further comprising a ground stud attached to said circuit board and the test board, to electrically ground said circuit board to the test board.

10. The apparatus as recited in claim 7, further comprising at least one second contact that couples said circuit board to said first contact.

11. The apparatus as recited in claim 10, wherein said circuit board has at least one metalized groove connected to said conductive layer, said metalized groove being adapted to engage said second contact.

12. The apparatus as recited in claim 10, further comprising a spring that biases said circuit board into contact with said second contact.

13. The apparatus as recited in claim 10, further comprising at least one tab connected to said first contact such that when said tab is moved from a first position to a second position, said second contact can allow said circuit board to be disengaged from said second contact.

14. The apparatus as recited in claim 7, further comprising at least one spring biased pogo pin in contact with said circuit board and the test board, to electrically couple said circuit board to the test board.

15. The apparatus as recited in claim 1, further comprising an alignment plate that aligns said first contact with the lead of the semiconductor package and the test board.

16. An apparatus that electrically couples a test board to a semiconductor package that has at least one lead, comprising;
    a housing;
    at least one first contact attached to said housing and adapted to engage the lead of the semiconductor package and the test board, such that the semiconductor package is electrically coupled to the test board;
    a capacitance control board operatively connected to said first contact, said capacitance control board being constructed to control the capacitance of said first contact;
    at least one second contact operatively connected to said first contact and said capacitance control board to electrically couple said first contact and said capacitance means; and,
    a spring that biases said capacitance control board into contact with said second contact.

17. The apparatus as recited in claim 16, wherein said capacitance control board is a circuit board with at least one internal conductive layer coupled to said second contact and the test board.

18. The apparatus as recited in claim 17, wherein said circuit board has at least one ground plane coupled to at least one ground lead of the semiconductor package, and at least one power plane coupled to at least one power lead of the semiconductor package.

19. The apparatus as recited in claim 18, wherein said circuit board has at least one metalized groove connected to said conductive layer, said metalized groove being adapted to engage said second contact.

20. The apparatus as recited in claim 19, further comprising an alignment plate that aligns said first contact with the lead of the semiconductor package and said second contact with said metalized groove of said capacitance control board.

21. The apparatus as recited in claim 17, further comprising at least one spring biased pogo pin in contact with said circuit board and the test board, to electrically couple said capacitance control board to the test board.

22. The apparatus as recited in claim 17, further comprising a ground stud attached to said capacitance control board and the test board, to electrically ground said capacitance control board to the test board.

23. The apparatus as recited in claim 16, further comprising at least one tab connected to said first contact such that when said tab is moved from a first position to a second position, said second contact can allow said capacitance control board to be disengaged from the second contact.

24. An apparatus that electrically couples a test board to a semiconductor package that has a plurality of leads, comprising;
 a housing having four walls;
 a plurality of first contacts attached to said housing and adapted to engage the leads of the semiconductor package and the test board, such that the semiconductor package is electrically coupled to the test board, each first contact being shaped as a loop which defines a first contact opening;
 four rods each attached to a corresponding wall, said rods extending through and separated from said first contact openings and being electrically grounded to control the inductance of said first contacts; and,
 a circuit board in contact with said first contacts to control the capacitance of said first contacts.

25. The apparatus as recited in claim 24, further comprising a plurality of second contacts adapted to engage said circuit board and electrically couple said first contacts with said circuit board.

26. The apparatus as recited in claim 25, wherein said circuit board has at least one internal ground plane coupled to at least one ground lead of the semiconductor package, and at least one internal power plane coupled to at least one power lead of the semiconductor package.

27. The apparatus as recited in claim 26, wherein said circuit board has at least one metalized groove connected to said conductive layer, said metalized groove being adapted to engage each of said second contacts.

28. The apparatus as recited in claim 25, further comprising a spring that biases said circuit board into contact with said second contacts.

29. The apparatus as recited in claim 25, further comprising at least one tab connected to said first contacts such that when said tab is moved from a first position to a second position, said second contacts can allow said circuit board to be disengaged from the second contacts.

30. The apparatus as recited in claim 27, further comprising an alignment plate that aligns said first contacts with the leads of the semiconductor package and the test board, and each of said second contacts with said at least one metalized groove of said circuit board.

31. The apparatus as recited in claim 24, further comprising at least one spring biased pogo pin in contact with said circuit board and the test board, to electrically couple said circuit board to the test board.

32. The apparatus as recited in claim 24, further comprising a ground stud attached to said circuit board and the test board, to electrically ground said circuit board to the test board.

33. The apparatus as recited in claim 24, wherein said housing has four end caps that restrain and electrically ground said rods.

34. The apparatus as recited in claim 24, wherein said first contact is a conductor that extends around said rod.

* * * * *